United States Patent
Tsuru

(10) Patent No.: US 11,152,915 B2
(45) Date of Patent: Oct. 19, 2021

(54) POLYPHASE FILTER

(71) Applicant: Mitsubishi Electric Corporation, Tokyo (JP)

(72) Inventor: Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/069,573

(22) Filed: Oct. 13, 2020

(65) Prior Publication Data

US 2021/0028769 A1    Jan. 28, 2021

Related U.S. Application Data

(63) Continuation of application No. PCT/JP2018/016014, filed on Apr. 18, 2018.

(51) Int. Cl.
| | |
|---|---|
| *H03H 11/22* | (2006.01) |
| *H03H 7/21* | (2006.01) |
| *H03H 7/01* | (2006.01) |
| *H03H 11/04* | (2006.01) |

(52) U.S. Cl.
CPC ............. *H03H 11/22* (2013.01); *H03H 7/01* (2013.01); *H03H 7/21* (2013.01); *H03H 11/04* (2013.01); *H03H 2007/0192* (2013.01); *H03H 2011/0494* (2013.01)

(58) Field of Classification Search
CPC . H03H 11/22; H03H 7/01; H03H 7/21; H03H 11/04; H03H 2007/0192; H03H 2011/0494
See application file for complete search history.

(56) References Cited

U.S. PATENT DOCUMENTS 3,618,133 A * 11/1971 Gingell .................. H03H 11/22
  333/24 R
2011/0092169 A1    4/2011 Savoj
2019/0379356 A1* 12/2019 Hirai ..................... H03H 11/20

FOREIGN PATENT DOCUMENTS

| JP | 3-267807 A | 11/1991 |
|---|---|---|
| JP | 2001-313644 A | 11/2001 |
| JP | 2002-26614 A | 1/2002 |
| JP | 2013-509096 A | 3/2013 |

OTHER PUBLICATIONS

European Search Report dated Nov. 26, 2020 in corresponding European Patent Application No. 18 915 760.5.

* cited by examiner

*Primary Examiner* — John W Poos
(74) *Attorney, Agent, or Firm* — Birch, Stewart, Kolasch & Birch, LLP

(57) ABSTRACT

A first input terminal is connected to a point of connection of a drain terminal of a first transistor and a gate terminal of a fourth transistor. A second input terminal is connected to a point of connection of a drain terminal of a third transistor and a gate terminal of a second transistor. One of first through fourth output terminals to is connected to a source terminal of each of the first through fourth transistors to. A gate terminal of the first transistor and a drain terminal of the second transistor are connected, and a gate terminal of the third transistor and a drain terminal of the fourth transistor are connected.

6 Claims, 3 Drawing Sheets

POLYPHASE FILTER

CROSS REFERENCE TO RELATED APPLICATION

This application is a Continuation of PCT International Application No. PCT/JP2018/016014, filed on Apr. 18, 2018, which is hereby expressly incorporated by reference into the present application.

TECHNICAL FIELD

The present disclosure relates to an RC polyphase filter.

BACKGROUND ART

RC polyphase filters are known as polyphase filters. A conventional RC polyphase filter includes a circuit constructed in a ring shape using four resistors and four capacitors, wherein the resistors R and the capacitors C are alternately connected in series, and includes first and second input terminals and first through fourth output terminals (for example, refer to Patent Literature 1). In such a polyphase filter, a predetermined frequency is differentially inputted from the first input terminal and the second input terminal, and a predetermined frequency having quadrature differences is outputted from the first through fourth output terminals.

CITATION LIST

Patent Literature

Patent Literature 1: JP 2013-509096 (A)

SUMMARY OF INVENTION

Technical Problem

A conventional RC polyphase filter is formed by, for example, polysilicon resistors and metal-insulator-metal (MIM) capacitors. Their resistance value and capacitance value which are required at this time are equal to the impedance of the input terminals and the impedance of the output terminals. Therefore, because the impedance of capacitance is $1/\omega C$, it is necessary to decrease the capacitance value with increase of the frequency. However, a problem with the conventional polyphase filters is that there is an influence of the minimum size of MIM capacitance in accordance with design rules for process, and therefore the downsizing is difficult, more specifically, high frequency operation is difficult.

The present disclosure is made in order to solve the above-mentioned problem, and it is therefore an object of the present disclosure to provide a polyphase filter that can implement downsizing and high frequency operation.

Solution to Problem

A polyphase filter according to the present disclosure includes a first transistor, a second transistor, a third transistor, and a fourth transistor, and a first output terminal is connected to a first terminal of the first transistor, a second output terminal is connected to a first terminal of the second transistor, a third output terminal is connected to a first terminal of the third transistor, a fourth output terminal is connected to a first terminal of the fourth transistor, a second terminal of the first transistor and a control terminal of the fourth transistor are connected at a first connection point and a first input terminal is also connected to the first connection point, a second terminal of the third transistor and a control terminal of the second transistor are connected at a second connection point and a second input terminal is also connected the second connection point, a second terminal of the second transistor and a control terminal of the first transistor are connected, and a second terminal of the fourth transistor and a control terminal of the third transistor are connected.

Advantageous Effects of Invention

In the polyphase filter of the present disclosure, the first input terminal is connected to the point of connection of the second terminal of the first transistor and the control terminal of the fourth transistor, and the second input terminal is connected to the point of connection of the second terminal of the third transistor and the control terminal of the second transistor. One of the first through fourth output terminals is connected to the first terminal of each of the first through fourth transistors, the control terminal of the first transistor and the second terminal of the second transistor are connected, and the control terminal of the third transistor and the second terminal of the fourth transistor are connected. As a result, downsizing and high frequency operation can be implemented.

DESCRIPTION OF EMBODIMENTS

Hereinafter, to explain the present disclosure in greater detail, embodiments of the present disclosure will be described with reference to the accompanying drawings.

Embodiment 1.

Figure 1:
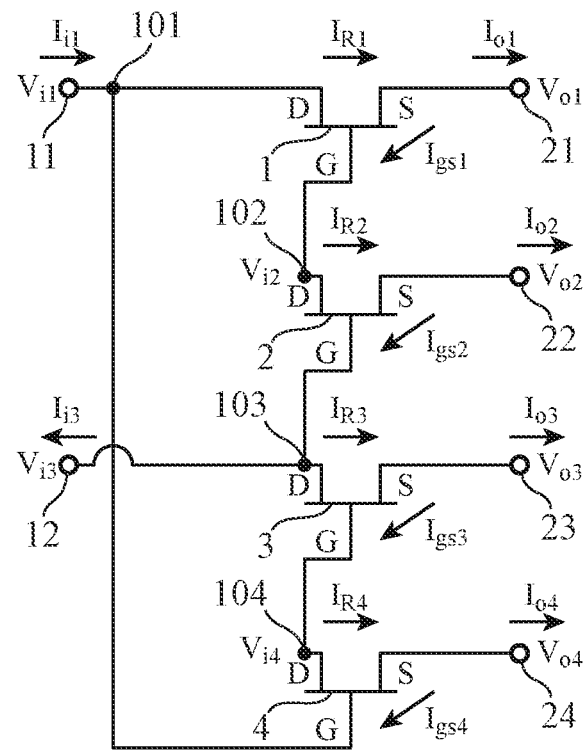
FIG. 1 is a schematic diagram showing a polyphase filter according to Embodiment 1 of the present disclosure.

FIG. 1 is a schematic diagram showing a polyphase filter according to this embodiment.

The polyphase filter shown in FIG. 1 includes a first transistor 1, a second transistor 2, a third transistor 3, and a fourth transistor 4. A first input terminal 11 is connected to a connection point 101 between a drain terminal of the first transistor 1 and a gate terminal of the fourth transistor 4. A second input terminal 12 is connected to a connection point 103 between a drain terminal of the third transistor 3 and a gate terminal of the second transistor 2. A first output terminal 21 is connected to a source terminal of the first transistor 1, a second output terminal 22 is connected to a source terminal of the second transistor 2, a third output terminal 23 is connected to a source terminal of the third transistor 3, and a fourth output terminal 24 is connected to a source terminal of the fourth transistor 4.

A gate terminal of the first transistor 1 and a drain terminal of the second transistor 2 are connected at a connection point 102, and a gate terminal of the third transistor 3 and a drain terminal of the fourth transistor 4 are connected at a connection point 104. In each of the first through fourth transistors 1 to 4, the source terminal corresponds to a first terminal, the drain terminal corresponds to a second terminal, and the gate terminal corresponds to a control terminal.

Next, the operation of the polyphase filter of Embodiment 1 will be explained.

An electric wave inputted from the first input terminal 11 is inputted to the connection point 101, and an electric wave inputted from the second input terminal 12, this electric wave having a differential relation with the electric wave inputted from the first input terminal 11, is inputted to the connection point 103. In the figure, $I_{i1}$ denotes an input current at the first input terminal 11, $I_{i3}$ denotes an input current at the second input terminal 12, $V_{i1}$ denotes an input voltage at the first input terminal 11, and $V_{i3}$ denotes an input voltage at the second input terminal 12.

The first output terminal 21 is connected to the second output terminal 22 via the gate-source junction of the first transistor 1, the second output terminal 22 is connected to the third output terminal 23 via the gate-source junction of the second transistor 2, the third output terminal 23 is connected to the fourth output terminal 24 via the gate-source junction of the third transistor 3, and the fourth output terminal 24 is connected to the first output terminal 21 via the gate-source junction of the fourth transistor 4. In the figure, $I_{R1}$ denotes a drain-source current of the first transistor 1, and $I_{o1}$ denotes an output current from the first output terminal 21. Similarly, $I_{R2}$ denotes a drain-source current of the second transistor 2, $I_{o2}$ denotes an output current from the second output terminal 22, $I_{R3}$ denotes a drain-source current of the third transistor 3, $I_{o3}$ denotes an output current from the third output terminal 23, $I_{R4}$ denotes a drain-source current of the fourth transistor 4, and $I_{o4}$ denotes an output current from the fourth output terminal 24. Furthermore, $I_{gs1}$ to $I_{gs4}$ denote gate-source currents of the first through fourth transistors 1 to 4, respectively.

Figure 2:
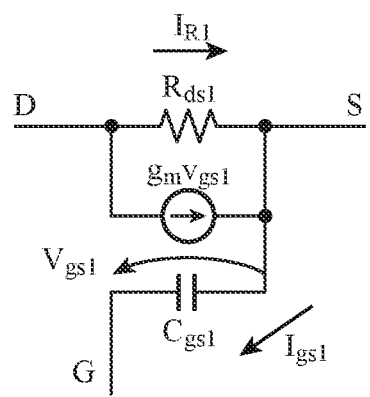
FIG. 2 is an equivalent circuit diagram of a first transistor of the polyphase filter according to Embodiment 1 of the present disclosure.
Figure 3:
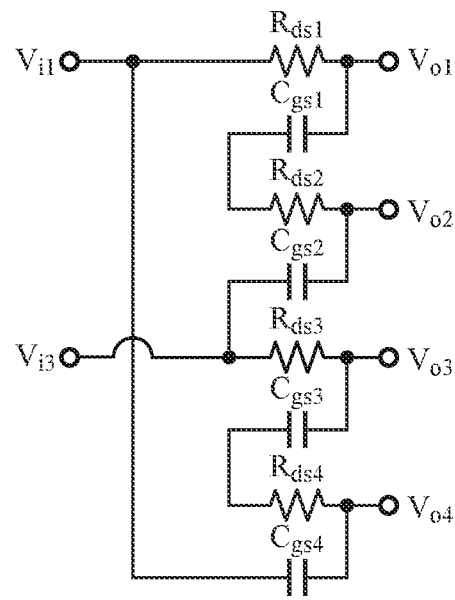
FIG. 3 is an equivalent circuit diagram of the polyphase filter according to Embodiment 1 of the present disclosure.

FIG. 2 shows an equivalent circuit of the first transistor 1. As shown in the figure, there exists a resistance $R_{ds1}$ between the drain and the source, and there exists a capacitance $C_{gs1}$ between the gate and the source. It can be assumed that no bias is applied to the transistor, and that the mutual conductance $G_m V_{gs1}$ between the drain and the source is open. Therefore, the polyphase filter shown in FIG. 1 can be assumed to be equivalently an RC polyphase filter (refer to an equivalent circuit of FIG. 3). Therefore, the outputs ($V_{o1}$ to $V_{o4}$) of the output terminals 21, 22, 23, and 24 differ in phase from one another by 90 degrees. The drain-source resistances $R_{ds1}$ to $R_{ds4}$ of the first through fourth transistors 1 to 4 do not contribute to a phase shift amount. Therefore, outputs having quadrature differences (e.g., 0 degrees, −90 degrees, −180 degrees, and −270 degrees) are acquired.

It is seen from the above explanation that a polyphase filter using transistors can be constructed. The transistors can be produced on the order of nanometers, while MIM capacitors can be produced only on the order of micrometers. Therefore, there is provided an advantage of downsizing and high frequency operation.

Furthermore, for the purpose of impedance matching, the size of the transistors may be set up in such a way that the absolute value of the impedance provided by the capacitance between the gate and the source of each of the transistors is equal to either the impedance between the first input terminal 11 and the second input terminal 12 or the impedance of the first through fourth output terminals 21 to 24, and the resistance component between the drain and the source of each of the transistors may be controlled using a bias voltage to be applied to the transistor. In addition, a resistor may be separately connected in parallel between the drain and the source of each of the transistors.

Figure 4:
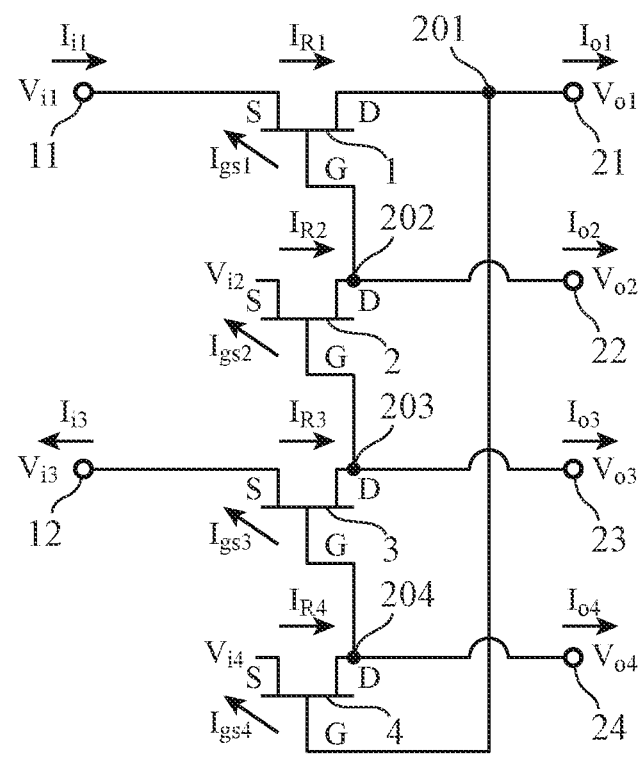
FIG. 4 is a schematic diagram showing another example of the polyphase filter according to Embodiment 1 of the present disclosure.
Figure 5:
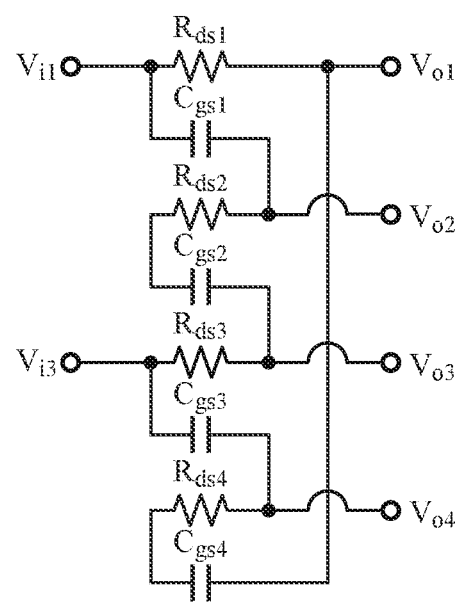
FIG. 5 is an equivalent circuit diagram of the other example of the polyphase filter according to Embodiment 1 of the present disclosure.

Furthermore, also in a case in which the first through fourth output terminals 21 to 24 are connected to the drain terminals of the first through fourth transistors 1 to 4, and the first input terminal 11 and the second input terminal 12 are connected to source terminals thereof, as shown in FIG. 4, the same advantage can be provided. In the figure, a connection point 201 is a connection point between the drain terminal of the first transistor 1 and the gate terminal of the fourth transistor 4, a connection point 202 is a connection point between the gate terminal of the first transistor 1 and the drain terminal of the second transistor 2, a connection point 203 is a connection point between the drain terminal of the third transistor 3 and the gate terminal of the second transistor 2, and a connection point 204 is a connection point between the gate terminal of the third transistor 3 and the drain terminal of the fourth transistor 4. FIG. 5 shows an equivalent circuit of the circuit of FIG. 4. As shown in the figure, the circuit can be assumed to be equivalently an RC polyphase filter.

Furthermore, another resistor may be loaded in parallel with the drain-source resistor of each of the first through fourth transistors 1 to 4, and another capacitor may be loaded in parallel with the gate-source capacitor thereof.

In addition, because the amplification action of each of the transistors is not used in this embodiment, it is not necessary to apply a DC voltage to each of the transistors. However, a DC voltage may be applied to each of the transistors so as to control the mutual conductance, the gate-source capacitance, and so on.

Furthermore, although in this embodiment the example in which field effect transistors are used as the transistors is explained, bipolar junction transistors can be similarly used. In this case, the first terminals are emitter terminals, the second terminals are collector terminals, and the control terminals are base terminals.

As previously explained, because the polyphase filter of Embodiment 1 includes the first transistor, the second transistor, the third transistor, and the fourth transistor, and the first output terminal is connected to the first terminal of the first transistor, the second output terminal is connected to the first terminal of the second transistor, the third output terminal is connected to the first terminal of the third transistor, the fourth output terminal is connected to the first terminal of the fourth transistor, the second terminal of the first transistor and the control terminal of the fourth transistor are connected and the first input terminal is also connected to a point of this connection, the second terminal of the third transistor and the control terminal of the second transistor are connected and the second input terminal is also connected to a point of this connection, the second terminal of the second transistor and the control terminal of the first transistor are connected, and the second terminal of the fourth transistor and the control terminal of the third transistor are connected, downsizing and high frequency operation can be implemented.

As an alternative, because the polyphase filter of Embodiment 1 includes the first transistor, the second transistor, the third transistor, and the fourth transistor, and the first input terminal is connected to the first terminal of the first transistor, the second input terminal is connected to the first terminal of the third transistor, the second terminal of the first transistor and the control terminal of the fourth transistor are connected and the first output terminal is also connected to a point of this connection, the second terminal of the second transistor and the control terminal of the first transistor are connected and the second output terminal is also connected to a point of this connection, the second terminal of the third transistor and the control terminal of the second transistor are connected and the third output terminal is also connected to a point of this connection, and the second terminal of the fourth transistor and the control terminal of the third transistor are connected and the fourth output terminal is also connected to a point of this connection, downsizing and high frequency operation can be implemented.

Furthermore, in the polyphase filter of Embodiment 1, because the first terminals are source terminals, the second terminals are drain terminals, and the control terminals are gate terminals, downsizing and high frequency operation can be implemented using field effect transistors.

As an alternative, in the polyphase filter of Embodiment 1, because the first terminals are emitter terminals, the second terminals are collector terminals, and the control terminals are base terminals, downsizing and high frequency operation can be implemented using bipolar junction transistors.

Furthermore, in the polyphase filter of Embodiment 1, because the impedance between the first terminal and the second terminal of each of the first through fourth transistors, the impedance between the first terminal and the control terminal of each of the first through fourth transistors, and the impedance between the first input terminal and the second input terminal are equal in absolute value, impedance matching as the polyphase filter can be implemented.

It is to be understood that various changes can be made to any components according to the embodiment or any components according to the embodiment can be omitted within the scope of the present disclosure.

INDUSTRIAL APPLICABILITY

As explained above, the polyphase filter according to the present disclosure relates to the configuration of a RC type polyphase filter and is suitable for use in high frequency circuits.

REFERENCE SIGNS LIST

1 first transistor, 2 second transistor, 3 third transistor, 4 fourth transistor, 11 first input terminal, 12 second input terminal, 21 first output terminal, 22 second output terminal, 23 third output terminal, 24 fourth output terminal, and 101 to 104 and 201 to 204 connection point.

The invention claimed is:

1. A polyphase filter comprising: a first transistor; a second transistor; a third transistor; and a fourth transistor, wherein
a first output terminal is connected to a first terminal of the first transistor,
a second output terminal is connected to a first terminal of the second transistor,
a third output terminal is connected to a first terminal of the third transistor,
a fourth output terminal is connected to a first terminal of the fourth transistor,
a second terminal of the first transistor and a control terminal of the fourth transistor are connected at a first connection point and a first input terminal is also connected to the first connection point,
a second terminal of the third transistor and a control terminal of the second transistor are connected at a second connection point and a second input terminal is also connected to the second connection point,
a second terminal of the second transistor and a control terminal of the first transistor are connected, and
a second terminal of the fourth transistor and a control terminal of the third transistor are connected,
wherein impedance between the first terminal and the second terminal of each of the first through fourth transistors, impedance between the first terminal and the control terminal of each of the first through fourth transistors, and impedance between the first input terminal and the second input terminal are equal in absolute value.

2. A polyphase filter comprising: a first transistor; a second transistor; a third transistor; and a fourth transistor, wherein
a first input terminal is connected to a first terminal of the first transistor,
a second input terminal is connected to a first terminal of the third transistor,
a second terminal of the first transistor and a control terminal of the fourth transistor are connected at a first connection point and a first output terminal is also connected to the first connection point,
a second terminal of the second transistor and a control terminal of the first transistor are connected at a second connection point and a second output terminal is also connected to the second connection point,
a second terminal of the third transistor and a control terminal of the second transistor are connected at a third connection point and a third output terminal is also connected to the third connection point,
and a second terminal of the fourth transistor and a control terminal of the third transistor are connected at a fourth connection point and a fourth output terminal is also connected to the fourth connection point,
wherein impedance between the first terminal and the second terminal of each of the first through fourth transistors, impedance between the first terminal and the control terminal of each of the first through fourth transistors, and impedance between the first input terminal and the second input terminal are equal in absolute value.

3. The polyphase filter according to claim 1, wherein the first terminals are source terminals, the second terminals are drain terminals, and the control terminals are gate terminals.

4. The polyphase filter according to claim 1, wherein the first terminals are emitter terminals, the second terminals are collector terminals, and the control terminals are base terminals.

5. The polyphase filter according to claim 2, wherein the first terminals are source terminals, the second terminals are drain terminals, and the control terminals are gate terminals.

6. The polyphase filter according to claim 2, wherein the first terminals are emitter terminals, the second terminals are collector terminals, and the control terminals are base terminals.

* * * * *